(12) United States Patent
Korenstein et al.

(10) Patent No.: US 11,402,548 B2
(45) Date of Patent: Aug. 2, 2022

(54) METHOD OF STRENGTHENING AN OPTICAL ELEMENT

(71) Applicant: RAYTHEON COMPANY, Waltham, MA (US)

(72) Inventors: Ralph Korenstein, Natick, MA (US); Christopher S. Nordahl, Chelmsford, MA (US)

(73) Assignee: RAYTHEON COMPANY, Waltham, MA (US)

( * ) Notice: Subject to any disclaimer, the term of this patent is extended or adjusted under 35 U.S.C. 154(b) by 1074 days.

(21) Appl. No.: 15/605,163

(22) Filed: May 25, 2017

(65) Prior Publication Data

US 2018/0341047 A1    Nov. 29, 2018

(51) Int. Cl.
| | |
|---|---|
| *G02B 1/14* | (2015.01) |
| *C23C 14/08* | (2006.01) |
| *C23C 14/10* | (2006.01) |
| *C23C 14/35* | (2006.01) |
| *F41G 7/22* | (2006.01) |

(52) U.S. Cl.
CPC ............. *G02B 1/14* (2015.01); *C23C 14/081* (2013.01); *C23C 14/082* (2013.01); *C23C 14/083* (2013.01); *C23C 14/086* (2013.01); *C23C 14/10* (2013.01); *C23C 14/35* (2013.01); *F41G 7/2253* (2013.01); *F41G 7/2293* (2013.01)

(58) Field of Classification Search
CPC ....... G02B 1/14; C23C 14/086; C23C 14/081; C23C 14/082; C23C 14/083; C23C 14/10; C23C 14/35; F41G 7/2253; F41G 7/2293
See application file for complete search history.

(56) References Cited

U.S. PATENT DOCUMENTS

| | | | |
|---|---|---|---|
| 4,907,846 | A | 3/1990 | Tustison et al. |
| 5,120,602 | A | 6/1992 | Tustison et al. |
| 5,135,814 | A | 8/1992 | Dekosky |
| 8,067,067 | B2 | 11/2011 | Sun et al. |
| 2011/0315807 | A1 | 12/2011 | Sunne |
| 2011/0315808 | A1 | 12/2011 | Zelinski et al. |
| 2013/0342921 | A1 | 12/2013 | Sunne et al. |
| 2014/0205370 | A1 | 7/2014 | Sunne et al. |
| 2016/0068686 | A1 | 3/2016 | Wahl et al. |
| 2018/0065995 | A1* | 3/2018 | Hopkins ................. C08L 83/06 |

OTHER PUBLICATIONS

Stefanik et al. "Nanocomposite Optical Ceramics for Infrared Windows and Domes", Window and Dome Technologies and Materials X, Proceedings of SPIE (2007) vol. 6545, pp. 65450A-1-65450A-5.

Sergeev et al. "Magnetron deposition of metal-ceramic protective coatings on glasses of windows of space vehicles", International Conference on Phyical Mesomechanics of Multilevel Systems, AIP Conference Proceedings (2014) vol. 1623, pp. 563-566.

International Search Report and Written Opinion in application No. PCT/US2018/032701 dated Jul. 27, 2018.

* cited by examiner

*Primary Examiner* — Nathan L Van Sell (74) *Attorney, Agent, or Firm* — Lando & Anastasi, LLP (57) ABSTRACT

According to various aspects and embodiments, a system and method for providing an optical element is disclosed. In one example, the optical element includes a substrate formed from a Nanocomposite Optical Ceramic (NCOC) material that includes a first oxide nanograin material dispersed in a second oxide nanograin material, and a compressive layer of the NCOC material formed on a surface of the substrate.

11 Claims, 10 Drawing Sheets

METHOD OF STRENGTHENING AN OPTICAL ELEMENT

FEDERALLY SPONSORED RESEARCH

This invention was made with government support under contract number N00014-07-C-0337 awarded by the United States Department of the Navy. The U.S. government has certain rights in the invention.

BACKGROUND

Commercial and military systems often have applications that use optical elements that are subjected to harsh environments. For example, airborne optical imaging systems, such as those found on infrared (IR) heat seeking missiles, often use an optical element such as a window or dome that is mounted on an exterior portion of the missile to isolate optics of the imaging system from an external environment through which the missile is flown. These optical elements must be transmissive in the wavelength spectrum (such as IR) used in the particular application, have a high degree of resistance to environmental exposures, and have sufficient strength to protect the remaining components of the imaging system during operation of the missile.

Materials conventionally used in airborne optical imaging systems include single crystal sapphire (alpha aluminum oxide) and aluminum oxynitride (AlON). These materials have a very high degree of strength and a relatively high degree of infrared transparency, particularly over the wavelength range of about 0.2 microns up to about 5 microns. For infrared dome materials used in medium wavelength infrared bands, AlON and single crystal sapphire are two superior candidate materials since each have relatively high degrees of both strength and infrared transmittance. Sapphire is conventionally considered the stronger of the two materials. However, sapphire is expensive to fabricate since it must be grown as a single crystal. In addition, sapphire is relatively brittle and non-elastic and exhibits significantly lower strength as temperature increases, especially above 600° C., which limits its use in hypersonic applications. Polycrystalline sapphire is not suitable for optical applications since polycrystalline sapphire has very high birefringence, which makes this material unsuitable for imaging infrared optical energy.

It is desirable to provide an optical element such as a window or dome that is constructed to provide both improved strength and hardness and has the ability to withstand the effects of long-term hypersonic aerodynamic friction and other environmental factors present in hostile operating environments.

SUMMARY

Aspects and embodiments are generally directed to optical elements, and more specifically to methods of strengthening and hardening optical elements.

Certain embodiments are directed to optical elements having substrates formed from nanocomposite optical ceramics (NCOCs) substrate materials comprising at least two component nanograin materials that are treated with a coating formed from the same material as the substrate. The coating is created using a different process than the process used for forming the substrate, which results in a different microstructure that makes the optical element both stronger and harder than an uncoated substrate formed from the same NCOC material.

According to one embodiment, an optical element comprises a substrate formed of a Nanocomposite Optical Ceramic (NCOC) material including a first oxide nanograin material dispersed in a second oxide nanograin material, and a compressive layer of the NCOC material formed on a surface of the substrate.

In one example, the compressive layer of the NCOC material has a microstructure different than a microstructure of the substrate. In one example the microstructure of the substrate has a grain size that is substantially uniform throughout the substrate and is in a range of about 100 nm to about 200 nm. In one example the microstructure of the compressive layer has a columnar polycrystalline grain structure with grain boundaries extending approximately perpendicular to the surface of the substrate.

In one example the optical element has a Knoop hardness measured on a surface of the compressive layer of at least 2000 kg/mm$^2$ for a 50 g load. In another example the optical element has a hardness value that is greater than a hardness value of an optical element comprising a substrate of the NCOC material formed without the compressive layer.

In one example the optical element has a flexural strength value of at least 600 MPa at room temperature. In another example the optical element has a flexural strength value that is greater than a flexural strength value of an optical element comprising a substrate of the NCOC material formed without the compressive layer. In yet another example the flexural strength value of the optical element is about 50% greater than the flexural strength value of the optical element comprising the substrate of the NCOC material formed without the compressive layer.

In one example the compressive layer has a thickness in a range of about 1.5 microns to about 6 microns. In another example the thickness of the compressive layer is in a range of about 3 microns to about 4 microns.

In one example the NCOC material of the substrate is a pyrolyzed NCOC material.

In one example the optical element further includes a protective layer of one of the first and the second oxide nanograin materials formed on the compressive layer.

In one example the NCOC material is substantially transparent over at least a portion of the infrared spectral band. In another example the first and the second oxide nanograin materials are selected from yttria ($Y_2O_3$), magnesia (MgO), aluminum oxide ($Al_2O_3$), magnesium aluminum oxide ($MgAl_2O_4$), zirconia ($ZrO_2$), calcium oxide (CaO), beryllium oxide (BeO), silica ($SiO_2$), and germanium oxide ($GeO_2$). In yet another example the first oxide nanograin material is yttria and the second oxide nanograin material is magnesia.

In one example the optical element is one of a dome, window, or lens.

Another embodiment is directed to a method for treating the surface of an optical substrate comprising providing an optical substrate formed of a Nanocomposite Optical Ceramic (NCOC) material including a first oxide nanograin material dispersed in a second oxide nanograin material, and depositing a compressive layer of the NCOC material on a surface of the optical substrate.

In one example depositing includes physical vapor deposition. In another example the physical vapor deposition includes sputtering. In yet another example the sputtering includes radio frequency (RF) magnetron sputtering. In one example the compressive layer is deposited at a pressure in a range of about 1 mTorr to about 5 mTorr.

In one example the NCOC material is formed using a flame spray pyrolysis method. In one example the optical substrate is formed by a process comprising packing the first and the second oxide nanograin materials into a mold, pressing the first and the second oxide nanograin materials into a near net shape green body, applying heat to densify the green body, and applying heat and pressure to make a fully dense optical substrate.

In one example the compressive layer is deposited to have a thickness in a range of about 1.5 microns to about 6 microns. In one example the method further comprises depositing a protective layer of one of the first and the second oxide nanograin materials onto the compressive layer. In some examples the protective layer is yttria.

Still other aspects, embodiments, and advantages of these example aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. Embodiments disclosed herein may be combined with other embodiments, and references to "an embodiment," "an example," "some embodiments," "some examples," "an alternate embodiment," "various embodiments," "one embodiment," "at least one embodiment," "this and other embodiments," "certain embodiments," or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Optical applications, including guidance systems, receive and send energy in the infrared (IR) region of the electromagnetic spectrum. The optical elements used in these systems, such as domes and windows, must therefore be transmissive in the IR spectral band and also function to protect the optical components of the guidance system. The optical elements must therefore be highly impact resistant and capable of withstanding water droplet (i.e., rain) and sand impact and provide thermal shock resistance, especially at hypersonic speeds.

Nonmetallic organic materials are inadequate for use in domes because aerodynamic friction heats the dome above the maximum operating temperature of the organic material. Ceramics such as sapphire are relatively brittle and non-elastic and the likelihood of fracture can be increased by the presence of small surface defects in the ceramic and externally imposed stresses and strains. Furthermore, machining sapphire into a final shape from a single sapphire ingot is a difficult and expensive process.

Coatings used to protect optical elements ideally need to exhibit the same or substantially similar optical properties as the substrate they are designed to protect so that there is little or no loss in optical information. Aerothermal heating also affects coating materials that contain certain materials, such as aluminum and silicon, which reduces their ability to transmit light energy. For instance, typical midwave infrared materials includes sapphire, spinel, polycrystalline alumina and AlON. All of these materials include Al—O bonds, and during flight at speeds exceeding Mach 1.5 windows or domes constructed from these materials undergo aerothermal heating due to friction and compression processes. As a result, the Al—O bonds begin to vibrate and emit photons at wavelengths starting at 4 microns. This emission approaches that of a black body at 700° K, reducing the transmittance and the signal to noise ratio. As a consequence, the optical device loses the ability to image the target.

Aspects of the present invention are directed to a coating that may be used on optical elements such as windows and domes that are formed from nanocomposite optical ceramic (NCOC) materials and are subjected to harsh environmental conditions. The coating provides increased strength and hardness to the optical element and offers the same optical properties, such as transmittance and refractive index, as the underlying substrate since the coating is formed using the same materials. The substrates discussed in this invention are coated with a layer of material that is the same as the substrate, a process that is generally referred to herein as a "same surface treatment" or SST. NCOC materials offer enhanced mechanical strength and thermal shock resistance in infrared (IR) radomes, and are also capable of providing lenses with specified or controlled thermo-optic properties. NCOC materials may also be used to provide reflective optical devices, such as mirrors, with controlled thermo-optic properties. Aspects and embodiments are directed to coating NCOC substrate materials with a layer of the same material as the nanocomposite ceramic substrate to form an optical element, such as a window, dome, or lens.

Figure 1A:
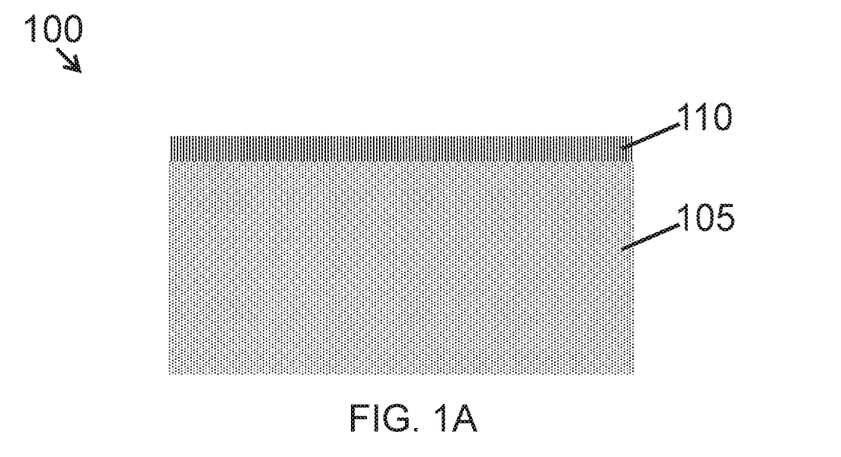
FIG. 1A is a cross-sectional view of one example of an optical element in accordance with aspects of the invention.
Figure 1B:
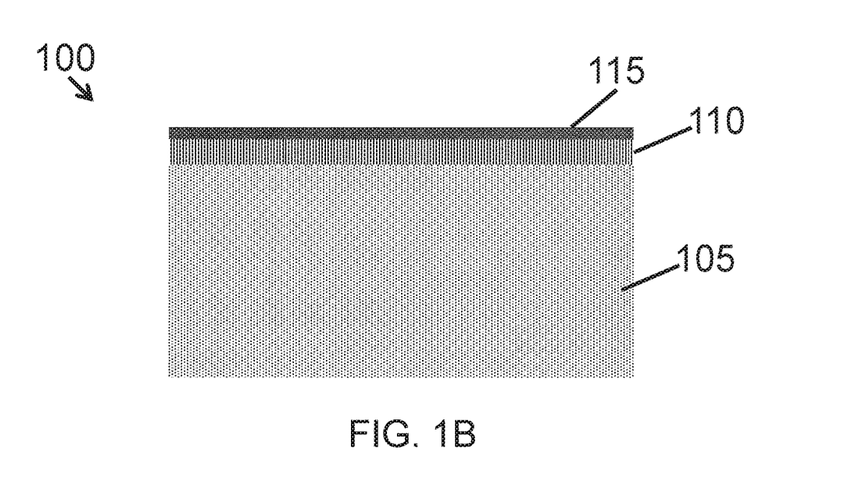
FIG. 1B is a cross-sectional view of another example of an optical element in accordance with aspects of the invention.

Referring now to FIG. 1A, a cross-sectional view of an embodiment of an optical element, generally indicated at 100, comprises a substrate 105 formed of a NCOC material and a coating layer 110 of the NCOC material formed on a surface of the substrate 105. NCOC materials are composite materials that are constructed with two or more nano-crystal grain types that are dispersed in one another. FIG. 1B is similar to FIG. 1A, but further includes a protective layer 115 disposed on the coating layer 110.

Figure 2A:
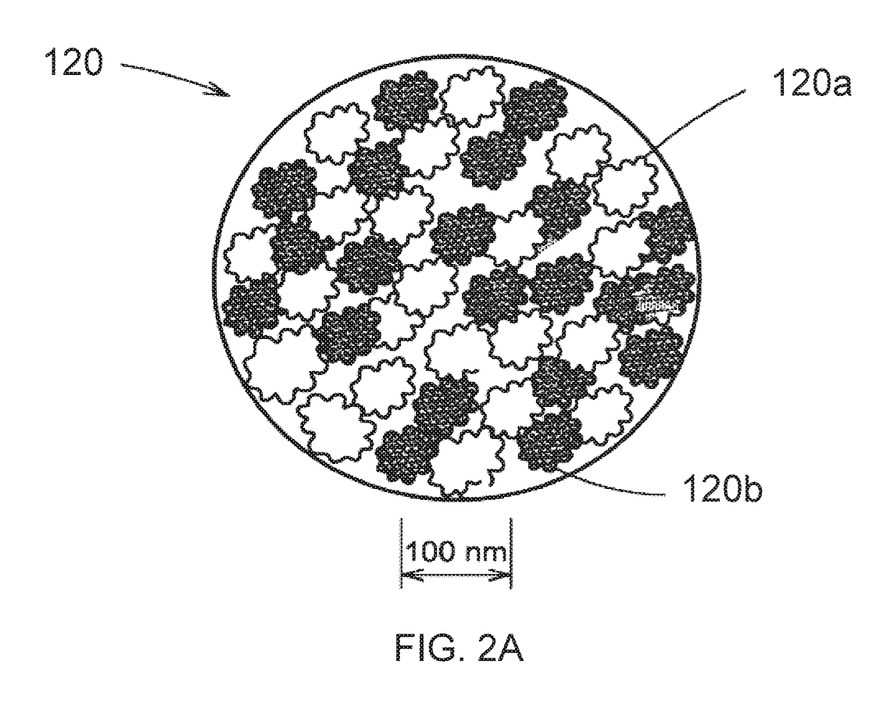
FIG. 2A is an enlarged schematic view of a portion of a substrate shown in FIGS. 1A and 1B.

FIG. 2A is an enlarged view of a section of the substrate 105 of the optical element in FIGS. 1A and 1B and shows the grain structure of the NCOC material 120. As discussed further below, according to some embodiments, the NCOC material 120 includes two different grain types 120a and 120b. In some instances, the size of the grains 120a and 120b that are grown in the NCOC material 120 may be controlled to remain well below the transmission wavelength of interest (e.g., the infrared band) to minimize interference scattering. According to one aspect, the grains 120a and 120b may be less than 100 nm in diameter on average, which allows for good optical, thermal, and mechanical properties. Although FIG. 2A shows two different grain types, NCOC materials having more than two grain types are within the scope of this disclosure. For instance, the NCOC material may include three, four, or more types of nanograins.

Figure 2B:
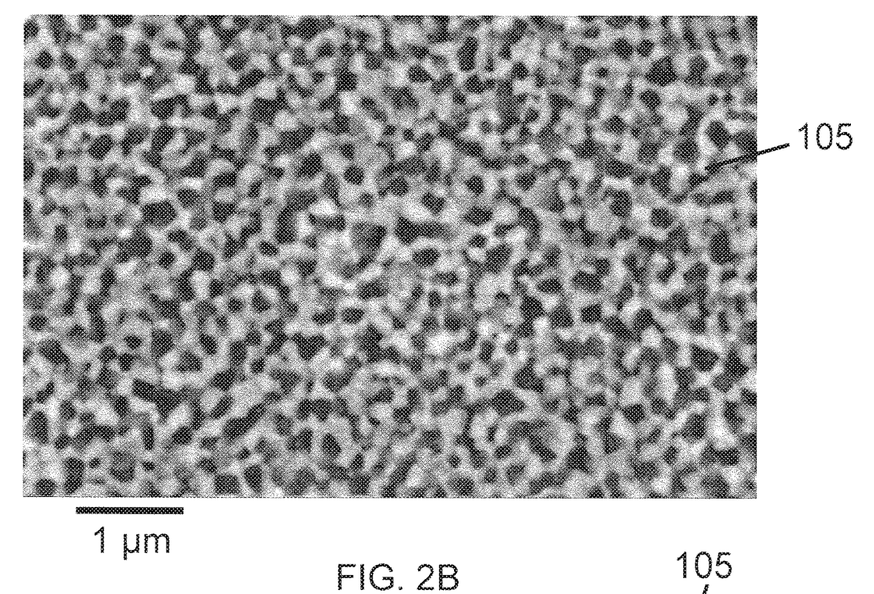
FIGS. 2B and 2C show a nanocomposite optical ceramic (NCOC) material used in a substrate at different magnifications comprising two different oxide nanograin materials in accordance with aspects of the invention.
Figure 2C:
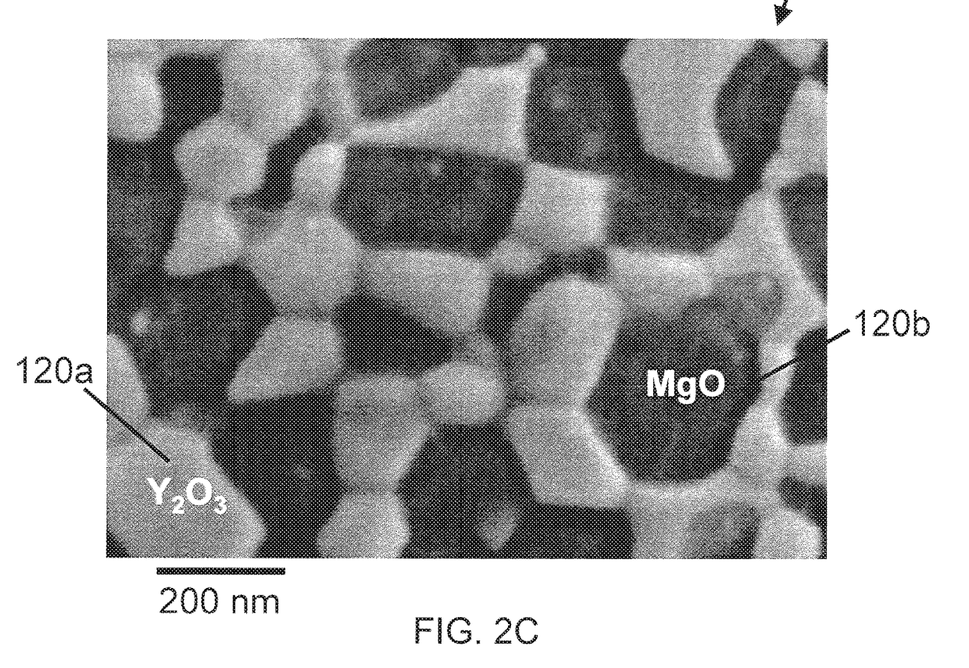

The different types of nanograins may be dispersed uniformly within a mixture in any desired ratio. The mixture depicted in FIGS. 2A-2C is 50/50 by volume. The relative percentages of the constituent nanograins in the powder (the composition of the powder) forming the NCOC material may be varied to achieve different optical properties, strength and thermal conduction. The relative percentages and types of nanograins may also be varied between different regions of the optical element. For instance, the percentages and types of nanograins may be varied between the spherical and conical portions of a dome.

In accordance with some embodiments, the substrate 105 is formed of a NCOC material comprising a first oxide nanograin material dispersed in a second oxide nanograin material. Oxide materials are generally harder than sulfide materials, but don't transmit as far into the IR spectrum as sulfides do. For instance, zinc sulfide (ZnS) is capable of transmitting up to long-wavelength IR of 20 microns (IR spans from about 700 nm to about 1 mm). In contrast, yttria ($Y_2O_3$) transmits up to about 8 microns. In addition, substrates constructed from NCOC materials that include oxide materials such as yttria and magnesia (MgO) do not exhibit sufficient strength and hardness to endure the stresses of a harsh environment, such as those required for military applications. The disclosed coating layer 110 provides the necessary hardness and strength to these substrates so that they may be used in these demanding environments and compete with other materials such as sapphire, which are much more expensive and difficult to process.

The two or more constituent or component nanograin materials may be selected from materials which are sufficiently transparent in the wavelength range of interest. For instance, the nanograin materials may be substantially transparent over at least a portion of the infrared (IR) spectrum including near-IR (wavelengths of approximately 0.75-1.4 µm), short-wavelength IR (approximately 1.4-3 µm), mid-wavelength IR (approximately 3-8.5 µm), and/or long-wavelength IR (approximately 8-12 µm). In some instances, the nanograin materials may be substantially transparent over one or more portions of the visible band (approximately 0.4-0.75 µm). As used herein, the term "substantially transparent" refers to materials which transmit at least about 90% of incident radiation, e.g., the material absorbs or reflects less than about 10% of the incident radiation. In some instances, the NCOC materials may transmit at least about 95% or at least about 99% of incident infrared radiation. In addition, the nanograin materials may be selected from materials that can be processed to retain nanograins of sub-micron size in at least one direction. The different types of nanograins may be chosen to be mutually neutral such that they do not react chemically with one another. In addition, the different types of nanograins may have similar refractive indices so as to avoid inter-particle scattering that would degrade optical performance.

According to some embodiments, the component nanograin materials are oxide nanograin materials. Non-limiting examples of oxide nanograin materials include yttria ($Y_2O_3$), magnesia (MgO), aluminum oxide ($Al_2O_3$), magnesium aluminum oxide ($MgAl_2O_4$), zirconia ($ZrO_2$), calcium oxide (CaO), beryllium oxide (BeO), silica ($SiO_2$), and germanium oxide ($GeO_2$).

FIGS. 2B and 2C show magnified photographs of a substrate 105 made from a NCOC powder material that includes two different nanograin materials. As shown in FIGS. 2B and 2C, the optical substrate 105 includes nanograins having a sub-micron grain dimension in at least the direction approximately perpendicular to the direction of propagation of the transmitted light. In some embodiments, substantially all of the nanograins have a sub-micron grain dimension in the direction approximately perpendicular to the direction of propagation of the transmitted light (and in some examples, all directions) that is less than approximately one tenth to one twentieth of the wavelength of transmitted light. The different nanograins form material barriers to grain growth of the other, which strengthens the NCOC material. The mixture of the nanograins determines the optical properties of the bulk material that forms the substrate 105.

The powder NCOC material that forms the substrate 105 is formed from nanograins with sub-micron dimensions, and there is no host matrix. Extensive testing has revealed that the presence of a host matrix of larger grains limits the achievable strength of the material even if reinforced with nano-dispersoids. Such a material would be inadequate to withstand the aerodynamic forces present in many applications, such as during the launch and flight of guided projectiles.

The NCOC material that forms the substrate 105 may comprise a first oxide nanograin material 120a that is dispersed in a second oxide nanograin material 120b. The example shown in FIGS. 2B and 2C shows a NCOC material where the first oxide nanograin material 120a is yttria and the second oxide nanograin material 120b is magnesia. The structure of each type of nanograin is clearly defined as shown in FIG. 2C. The first and the second oxide nanograins 120a and 120b have a grain dimension that is sub-micron in all directions. According to some embodiments, the grain dimension is less than approximately one-tenth the IR transmission wavelength.

Referring back to FIG. 1A, a coating layer 110 is disposed on a surface of the substrate 105. The coating layer 110 may be formed from the same NCOC material that forms the substrate, meaning that the same mixture of two or more nanograins that form the material of the substrate 105 may be used to form the material of the coating layer 110. Thus, the ratio of the constituent (e.g., first and second) nanograins of the mixture that forms the coating layer 110 is the same as that of the substrate. This ensures that the optical properties of the substrate 105 and the coating layer 110 are substantially the same.

According to some embodiments, the coating layer 110 is a compressive layer, and these terms may be used interchangeably within this disclosure. As used herein, the term "compressive layer" refers to a layer of material that is capable of compressing or contracting and tending to compress or contract and is under an intrinsic compressive strain. The compressive strain may be produced by a lattice mismatch, i.e., crystal structure, between the lattice dimension of the coating layer and the lattice dimension of the substrate.

According to some embodiments, the compressive layer 110 of the NCOC material has a microstructure that is different than a microstructure of the substrate. As used herein, the term "microstructure" refers to a microscopic structure of a material and can encompass, for example, a lattice structure, crystallinity, dislocations, grain boundaries, constituent atoms, doping level, surface functionalization, and the like. Since a material can comprise components in the nanometer range, a microstructure of the material can sometimes be referred to as a nanostructure of the material. The microstructure can therefore refer to observable or detectable features of a phase or region of material. For example, microstructures can differ by crystalline arrangements of atoms, the presence or absence of crystalline phases in the material, the geometry of phases or structures in the material or the like. According to another example, the compressive layer 110 may have a grain geometry that is different than a grain geometry of the substrate 105.

According to one embodiment, the microstructure of the substrate 105 has a grain size that is substantially uniform throughout the substrate. In some embodiments, the grain size is less than 1 micron. In some embodiments, the grain size is in a range of about 100 nm to about 200 nm. In other embodiments, the grain size of the substrate 105 is about 100 nm. In still other embodiments, the grain size of the substrate 105 is about 85 nm. As discussed in further detail below, the NCOC materials may be created using a flame spray pyrolysis technique. These NCOC materials are then used to form the substrate and are also the materials used in forming the compressive coating. As discussed further below, the microstructure of the substrate 105 may be created or may otherwise be generated by the process that forms the substrate 105. Likewise, the microstructure of the compressive coating 110 is created by the process that forms the compressive coating 110, which is also discussed in further detail below.

Figure 3A:
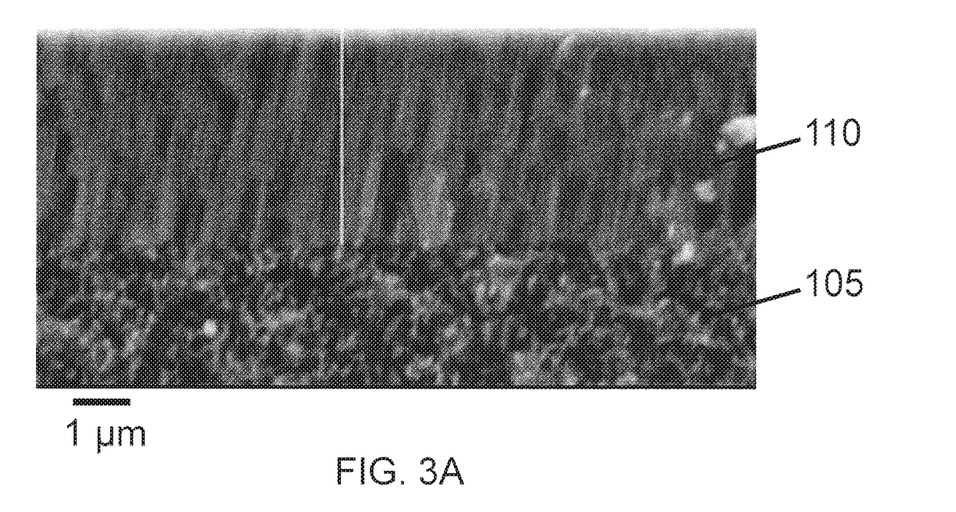
FIGS. 3A and 3B show a NCOC material comprising two different nanograin materials used in a substrate and as deposited as a compressive layer on the substrate at different magnifications in accordance with aspects of the invention.
Figure 3B:
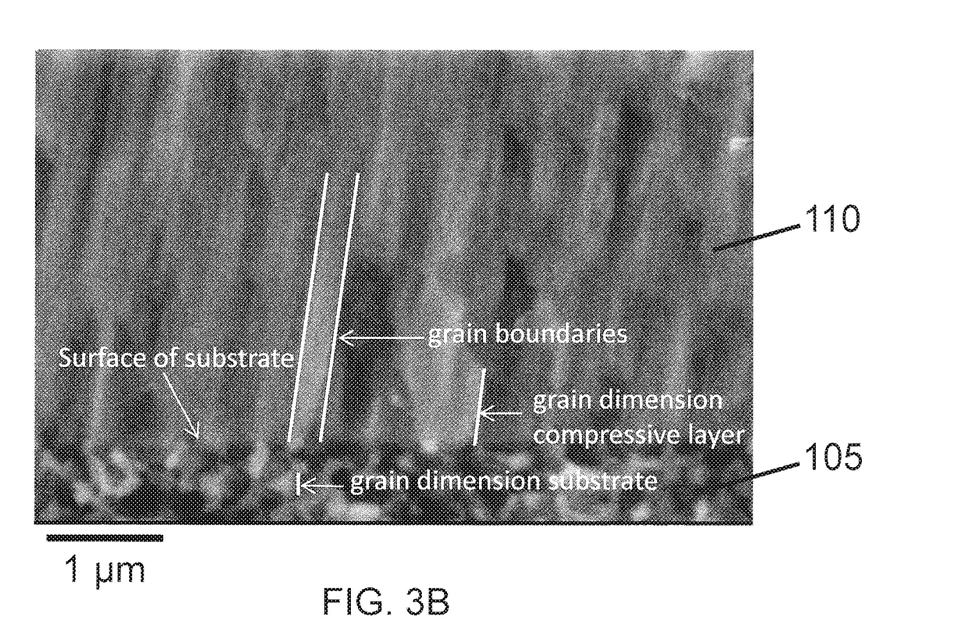

In accordance with some embodiments, the microstructure of the compressive coating 110 has an elongated columnar grain structure or a columnar polycrystalline grain structure, and may also be described herein as having elongated or columnar polycrystalline grains. For instance, the longitudinal grains of the compressive coating 110 may take on a generally columnar polycrystalline form along the external surface of the substrate 105. This type of grain structure can be seen in FIGS. 3A and 3B. FIG. 3A is a cross-sectional view of a compressive coating 110 deposited on a substrate 105, and FIG. 3B is the same cross-sectional view as FIG. 3A but at a higher magnification. According to the example shown in FIGS. 3A and 3B, the NCOC material includes yttria and magnesia as the component nanograin materials.

The two different microstructures of the substrate 105 and the compressive coating 110 are evident in the photographs of FIGS. 3A and 3B. According to certain embodiments, the grain boundaries of the microstructure of the compressive coating 110 extend approximately perpendicular to the surface of the substrate 105. This is also shown in FIGS. 3A and 3B, and one example of these grain boundaries has been labeled in FIG. 3B as two parallel lines that border the edges of one grain boundary. As indicated in FIG. 3B, the grain boundaries may not be exactly perpendicular, and may be at a slight angle with the surface of the substrate 105. For instance, the grain boundaries of the microstructure of the compressive coating 110 may be at an angle that is in a range of 70-90 degrees with the surface of the substrate 105. In some embodiments, the compressive layer 110 may include nanograins that have a grain size or dimension that is greater than a grain size or dimension of the nanograins of the substrate 105. For instance, FIG. 3B includes a label for a grain dimension of a nanograin of the compressive layer 110 that is larger than a grain dimension of a nanograin of the substrate 105. In accordance with one embodiment, a grain dimension of the compressive coating may approach the value of or otherwise take on the dimension of the thickness of the compressive layer 110.

In accordance with various aspects, the presence of the compressive coating 110 on the external surface of the substrate 105 may add strength and hardness to the optical element 100. The compressive layer places the outer surface of the substrate 105 into compression and the inner surface of the substrate 105 into tension, which increases the strength of the overall optical element 105. Any strength-limiting surface flaws, such as cracks or other discontinuity present on the surface of the substrate 105 may be filled in and/or are pressed closed (compressed) by the compressive force of the compressive layer. According to various aspects, it is this closing of the surface flaws that imparts increased strength to the overall optical element 100. Strength-limiting defects in the substrate surface may be created by grinding and polishing processes used during fabrication of the substrate 105. These processes generate sub-surface damage that may be masked or otherwise modified by the presence of the compressive coating 110.

According to various aspects, the microstructure of the compressive coating 110 may be created by the process that forms the compressive coating 110. As discussed in further detail below, compressive coatings of NCOC materials may be created using a PVD process, such as sputtering. This process may allow for the NCOC material to form and solidify in a columnar form such as that shown in FIGS. 3A and 3B. For instance, these columnar grain structures can be directionally solidified structures with grain boundaries extending in the longitudinal direction. As noted above, this kind of structure may increase the mechanical strength and hardness of the optical element 100. Furthermore, the grain boundaries of the nanograins that form the microstructure of the compressive coating 110 may not include any transverse grain boundaries.

Once deposited, the compressive coating 110 closes any surface flaws present on the surface of the optical substrate 105 and the compressive stress of the coating layer increases the hardness and strength of the optical element 100. In addition, since the coating is the same material as the nanocomposite forming the substrate, there is no optical consequence to the optical performance of the nanocomposite optical element.

In accordance with some embodiments, a protective layer may be deposited onto the compressive layer. Referring to FIG. 1B, a protective layer 115 may be deposited onto a surface of the compressive layer 110. In some embodiments, the protective layer 115 is one of the nanograin materials that form the NCOC. For instance, according to one embodiment, a first oxide nanograin material is yttria and a second oxide nanograin material is magnesia, and the protective layer 115 is formed from yttria. In this instance, the compressive layer 110 includes magnesia, which is known to react with water, and therefore yttria may be added to help protect the compressive coating 110. The protective coating 115 may be deposited using nanograins generated by the process described below. The protective coating 115 may also be deposited using a PVD process as described below, including a RF magnetron sputtering process. For example, yttria that forms the protective coating 115 may be prepared as a separate sintered ceramic target in the deposition chamber and applied during a single process (i.e., in the same process as depositing the compressive layer, but after depositing the compressive layer). For instance, after depositing the compressive layer, power to the target(s) used in forming the compressive layer may be turned off, and the power to the protective layer target (e.g., the sintered ceramic target of yttria) may be turned on for purposes of depositing the protective layer 115 (which in this example is yttria). Therefore, compressive layer target material(s), the sample, and the protective layer target material(s) can be loaded into the deposition chamber at one time.

In some embodiments, the protective coating 115 may be deposited up to a thickness of about 4 microns. In some instances, the protective coating 115 may be deposited up to a thickness of about 3 microns. According to certain embodiments, the thickness of the protective coating 115 may be as thin as 0.1 microns (1000 Angstroms). The protective coating 115 may be any thickness that is suitable for the purposes of protecting the underlying compressive coating 110 from environmental effects or other detrimental effects that may be experienced by the compressive coating 110 during use or operation.

Figure 4:
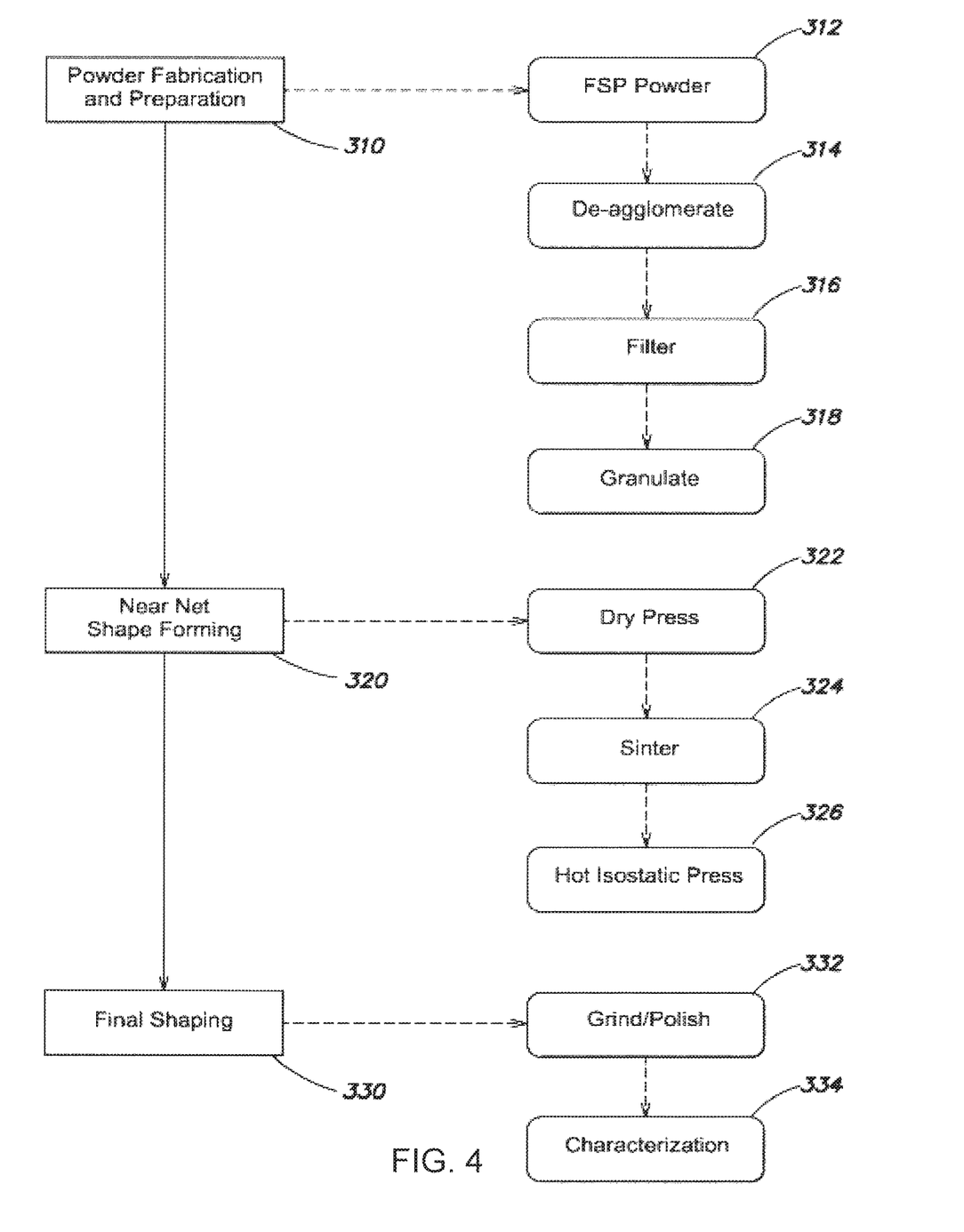
FIG. 4 is a flow diagram of one example of a method of making a substrate from an NCOC material in accordance with certain aspects of the invention.

FIG. 4 is a flow diagram of one example of a method of manufacturing an optical substrate using NCOC materials. Step 310 includes the fabrication and preparation of NCOC powder that may be used to produce both the substrate and coating.

Figure 5:
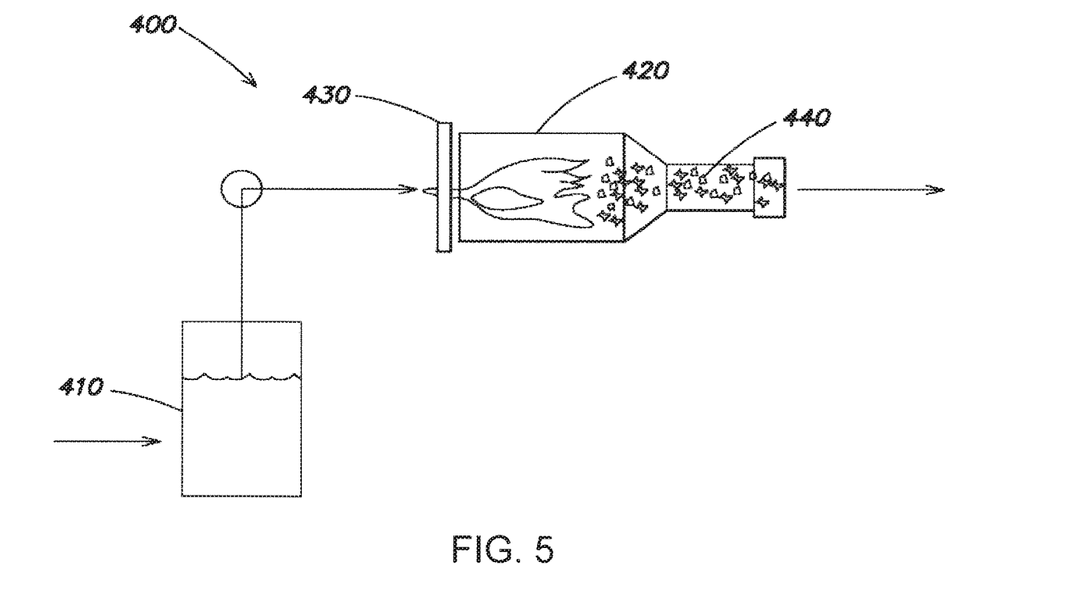
FIG. 5 is a block diagram illustrating a flame spray pyrolysis apparatus for producing NCOC materials in accordance with aspects of the invention.

According to some embodiments, the NCOC powder (NCOC material) may be formed using a flame spray pyrolysis process (step 312). Flame spray pyrolysis (FSP) is a technique for the synthesis of high purity nano-particle materials with controlled particle size and crystallinity in a single step, and has been used in a variety of applications. FSP may be used to form powder materials from chemical precursors. FIG. 5 illustrates an example apparatus 400 that may be used to perform the flame spray pyrolysis process 312. The apparatus 400 includes a precursor solution reservoir 410 coupled to a quartz combustion chamber 420 via a cooling collar 430. A precursor solution including the two or more selected component materials is collected in the reservoir 410 and fed into the combustion chamber 430. The precursor solution may comprise metal alkoxides and solvents, and NCOC powder is generated when the precursor solution is combusted. For instance, according to some embodiments, the precursor solution contains ions of magnesia and yttria, and upon combustion nanoparticles of magnesium oxide and yttrium oxide are formed. The combustion chamber also receives a gaseous fuel (not shown) used to achieve combustion inside the chamber. A solution 440 from the combustion chamber 420 includes a nanopowder including the two or more component materials along with the by-products of combustion, namely carbon-dioxide ($CO_2$) and water vapor ($H_2O$). The solution 440 is fed to a separation device (not shown) such as, for example, a centrifuge, a cyclone separator, electrostatic precipitators, filters, and thermoplastic sampling devices, among others, where the nanopowder is separated out and collected for further processing. In some examples, the nanopowder may be in solution with a liquid at this stage.

Referring again to FIG. 4, once the solution 440 containing the nanopowder has been produced, it may be ground and mixed, for example in a mill or similar device, to break up any "clumps" (step 314). The solution 440 may then be filtered (step 316) to remove impurities and/or any large particles (e.g., those exceeding a maximum desired particle size for the NCOC material) from the solution. A granulation step 318 may include removing liquid from the solution and drying the powder.

Next, the nanopowder may undergo initial shape-forming steps to produce the rough shape of the substrate forming optical element, such as a dome, window, or lens (step 320). This initial shaping step 320 may achieve near to the net (or final) shape of the optical component. Step 320 may include a dry press step 322 that includes packing the nanopowder into a mold and applying pressure to remove voids. According to some embodiments, the pressure applied to the mold is in a range of about 15 to about 30 ksi. In at least one embodiment, the pressure is applied at room temperature.

A sintering step 324 may include applying heat to sinter the molded compact removed from the mold to form a sintered compact. Sintering is performed at temperatures suitable for densifying the molded compact. For instance, sintering may be used to densify the molded compact to theoretical densities of greater than 97% to achieve closed porosity. For instance, the porosity of the formed substrate 105 may be less than 1.5%. In some embodiments, sintering may be performed at a temperature in a range of about 1300° C. to about 1400° C.

The shaping process 320 may further include applying a hot isostatic press (HIP) (step 326), which functions as a final densification step. In step 326, very high pressure may be applied to the sintered compact to squeeze out any remaining voids and make the material "fully dense." According to some embodiments, the HIP process may be performed at a pressure in a range of about 20 to about 30 ksi and at a temperature in a range of about 1300° C. to about 1400° C.

The base substrate produced at the end of step 320 may then be processed in a final shaping and finishing step 330 to produce the finished optical substrate. This step 330 may include a precision grinding and/or polishing step 332 in which any excess material is removed from the optical substrate, and the surface(s) are ground and polished to achieve an optical finish. Step 330 may further include a characterization step 334 of the optical substrate's mechanical and optical properties to verify that the optical substrate meets specifications.

Figure 6:
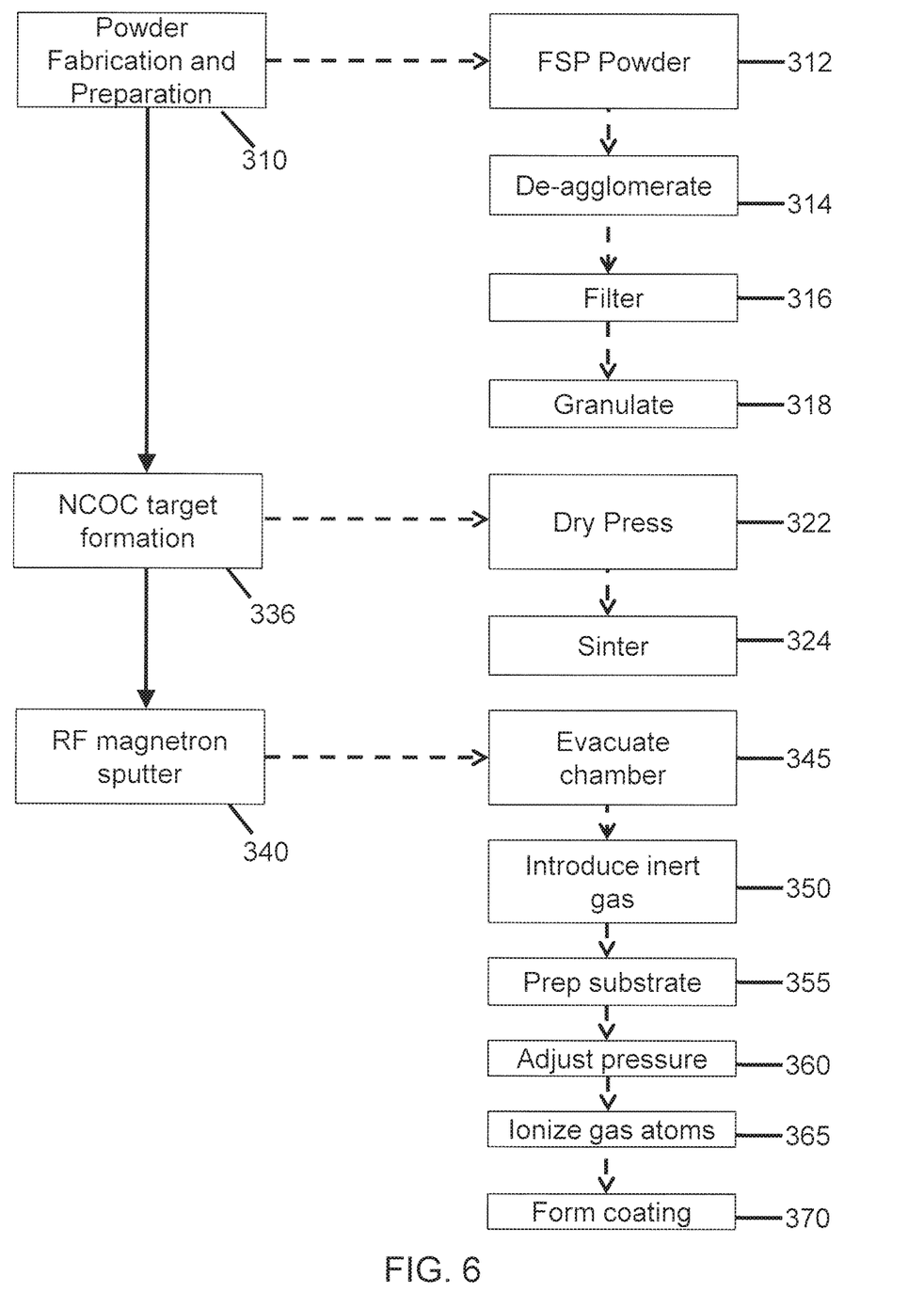
FIG. 6 is a flow diagram of one example of a method of making a compressive coating from NCOC materials in accordance with certain aspects of the invention.

FIG. 6 is a flow diagram of one example of a method for forming the compressive coating using NCOC materials. Step 310 includes the fabrication and preparation of NCOC powder discussed above that may be used to form the substrate. The NCOC powder used in forming the compressive coating can be formed using the flame spray pyrolysis process discussed above, and therefore may include one or more steps 312-318 as previously discussed in reference to FIG. 4. The NCOC material that forms the compressive coating has the same composition as the NCOC material that forms the substrate. The substrate is formed first, and then coated with the compressive layer.

In accordance with various embodiments, the compressive layer 110 of NCOC material may be deposited using a physical vapor deposition (PVD) process. PVD processes utilize the physically vaporized form of a desired coating material to create a deposited film on a substrate. Techniques include those that facilitate a physical (rather than a chemical) vaporization of the base material, and include techniques such as electron beam evaporation, thermal evaporation, point source evaporation, plasma enhanced physical vapor deposition, arc deposition, and magnetron sputtering. These processes use one of the following methods for converting the solid coating source material into a gaseous/vapor plasma: resistance or induction heating, electron beam or ion bombardment, electric arc, and plasma.

Conventional PVD processes include placing the substrate to be coated within a deposition chamber, which may be evacuated, and depending on the process, a controlled atmosphere of a certain gas is created inside the deposition chamber. The coating material to be deposited on the substrate is generated within or introduced into the chamber, and assumes the form of a plasma that includes gaseous vapors and solid particulate matter. The plasma may include atoms, molecules, ions, and agglomerates of molecules of the coating material. The coating or deposition process itself occurs by condensation of the plasma coating particles onto the substrate surface to be coated.

Referring back to FIG. 6, NCOC target formation for use in the deposition of the compressive layer 110 may be performed at step 336. According to one embodiment, step 336 includes one or more steps used in the shaping process 320 discussed above in reference to FIG. 4 to prepare the target NCOC material 125. For example, target NCOC material 125 (shown in FIG. 7) may be formed using the dry press 322 and sintering 324 steps as previously discussed. The target NCOC material 125 may be a pressed, sintered, free standing body that can be used during the RF magnetron sputter deposition process 340 discussed below to deposit NCOC material onto the substrate 105.

The target NCOC material 125 may be deposited directly onto a surface of the optical substrate 105 as a continuous layer. In some embodiments, the compressive layer 110 may be deposited to a thickness of between about 1.5 microns to about 6 microns. According to one embodiment, the compressive layer 110 may be deposited to a thickness of between about 3 microns to about 4 microns. According to another embodiment, the compressive layer 110 may be deposited to a thickness of about 3.5 microns. Other thicknesses are also within the scope of this disclosure. For instance, according to at least one embodiment the compressive layer 110 may be tens of microns thick.

Figure 7:
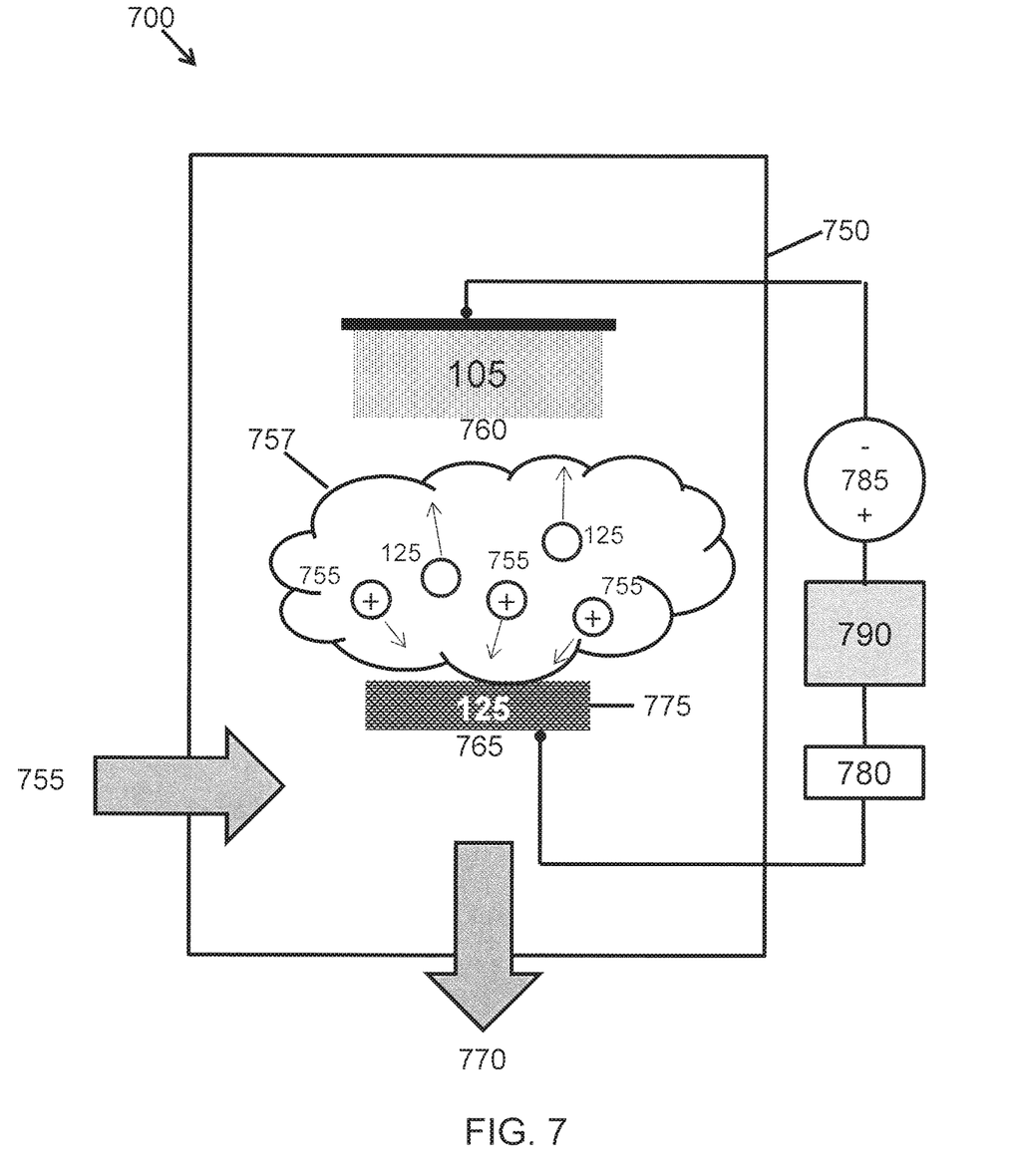
FIG. 7 is a block diagram illustrating a deposition device for producing a coating layer in accordance with aspects of the invention.

In accordance with one embodiment, and as shown in FIG. 7, a radio frequency (RF) magnetron sputter process 340 may be used to form the compressive coatings from NCOC materials. FIG. 7 illustrates an example apparatus 700 that may be used to perform the RF sputter process 340. The apparatus 700 includes a vacuum chamber 750 that is evacuated via a vacuum pump 770 to vacuum pressures. In the apparatus 700, energetic ions 755, which in some embodiments are argon ions, are introduced into the chamber 750 and ionized to a positive charge. The positively charged ions 755 bombard a target 775 that holds the target NCOC material 125 that includes the two or more nanograins used in forming the optical substrate 105. The target 775 is part of the magnetron cathode 765 of the discharge and is maintained at negative, while the wall of the chamber 750 is grounded, such that when power is applied to add energy to the gas ions 755, this causes the ions 755 to be accelerated toward the target 775. During the acceleration, the ions 755 gain momentum and strike the target 775. This causes the target NCOC material 125 to be ejected from the target and deposit on the anode 760, which is the substrate 105.

The magnetic field of the magnetron cathode 765 is oriented parallel to the cathode surface, which causes the plasma density to be much higher than that provided by a DC diode sputtering system. In RF magnetron sputtering, the magnetron cathode 765 (the target 775) and the anode 760 are in series with a blocking capacitor 780, which functions to provide the DC self-bias, and is part of an impedance-matching network 790 that provides the power transfer from the RF power source 785 to the plasma discharge. The RF power supply 785 is a high voltage power source and the matching network 790 functions to optimize power transfer from the RF power source 785 to the plasma 757. The RF power source 785 may be configured to provide over 1000 volts to sputter the NCOC material.

RF sputtering allows for the electrical potential of the current in the vacuum environment to alternate at radio frequencies, which eliminates or otherwise avoids charges building up on the target materials. The build-up of charge can result in arcing into the plasma 757, which can cause defects in the deposited layer and other process issues, including the inability to deposit the target material. The AC power used in RF sputtering allows for both a positive electric field, where the positive ions 755 accelerate to the surface of the target 775, and a negative field, where the charging positive ions on the surface of the target can be removed.

Referring again to FIG. 6, once the target NCOC material 125 has been prepared, an RF magnetron sputtering process may be used to deposit the target NCOC material 125 onto a surface of the optical substrate 105 (step 340). The target NCOC material 125 and the optical substrate 105 may be placed into a deposition chamber, such as the vacuum chamber shown in FIG. 7. Air is removed from the vacuum chamber 750 using the pump 770 to an initial vacuum pressure below approximately $5 \times 10^{-6}$ Torr (step 345). After or during the chamber evacuation, an inert gas, such as argon, may be introduced into the deposition chamber (step 350). At step 355 the substrate 105 sample is prepared through a heating and cooling process. According to one embodiment, the substrate 105 sample may be heated for about 1 hour to a temperature of about 100° C. and then cooled to room temperature. According to some embodiments, the pressure of the vacuum chamber may be adjusted to a deposition pressure that is in a range of about 1 mTorr to about 5 mTorr (step 360).

Once a desired deposition pressure has been achieved, the deposition process may begin. The inert gas atoms are ionized (step 365) and form a plasma 757 and are accelerated by an electrical field superimposed on the negatively charged target 775. The positive ions 755 strike the target NCOC material 125 of the target 775 with sufficient force to dislodge and eject NCOC material from the target 775. The ejected target NCOC material 125 deposits on the surface of the optical substrate 105 to form the compressive coating (step 370). According to one or more embodiments, the deposition is performed at a sputtering power in a range of about 250 to 350 W. In some embodiments, deposition may take 8-16 hours to deposit a coating that is 2-5 microns thick.

According to various embodiments, the RF magnetron sputtering process 340 deposits a compressive layer of NCOC material at a rate in a range of about 0.2 to about 0.5 Angstroms/second. Due to this low deposition rate, two or more locations of target NCOC material 125 (and corresponding substrate 105 samples) may be used in the vacuum chamber 750 such that multiple targets of NCOC material may be sputtered and deposited simultaneously on multiple samples.

Figure 8:
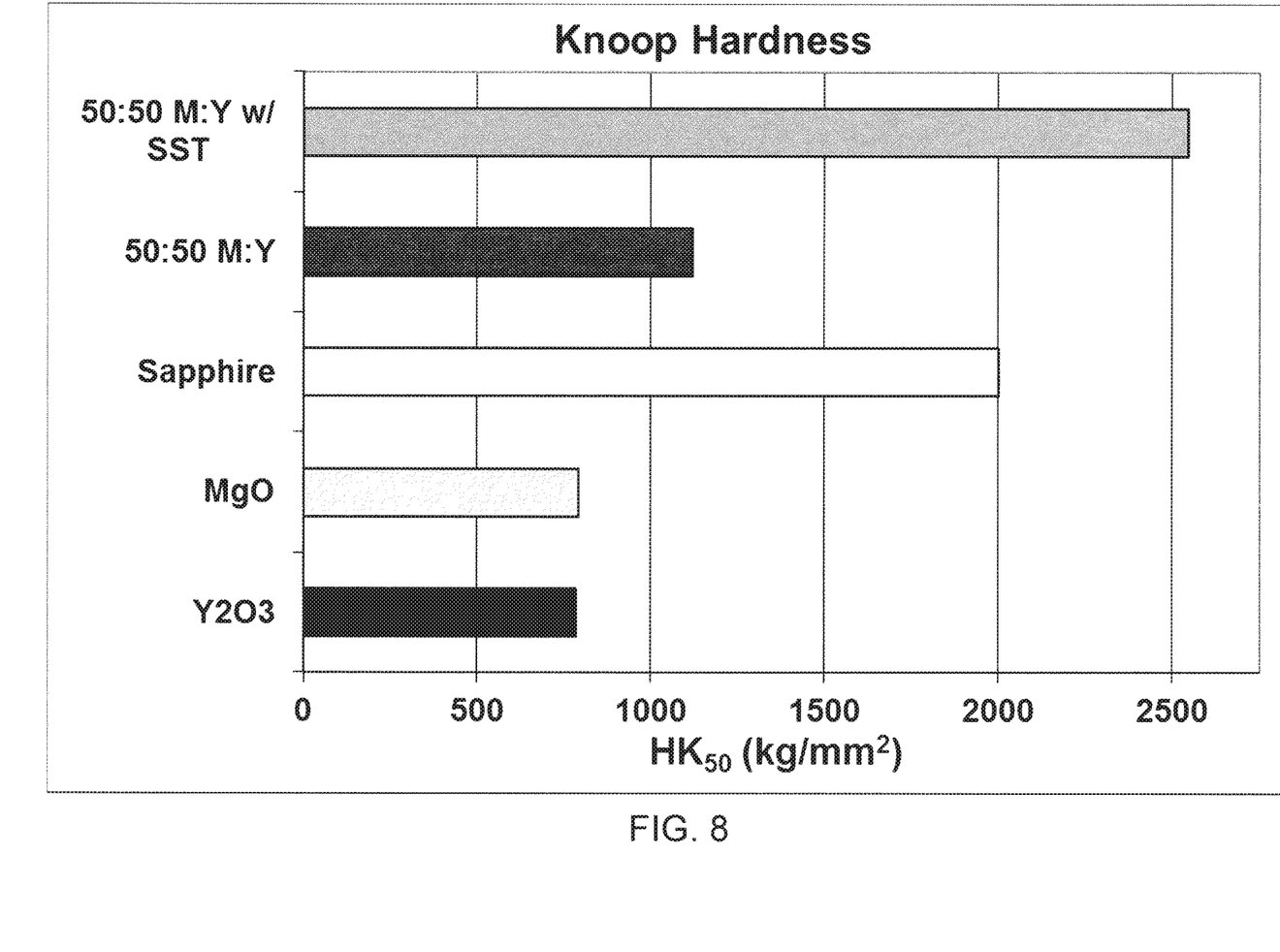
FIG. 8 is a graph comparing Knoop hardness values for various materials, nanocomposites, and treated nanocomposites in accordance with aspects of the invention.

Referring now to FIG. 8, a graph shows the Knoop hardness levels for various materials, including substrate NCOC materials and a treated NCOC material that has been coated with a compressive coating of the NCOC material. The data shown in the graph of FIG. 8 was generated using 1.25 inch diameter samples of material and 20 measurements were made with a 50 gram (g) load. The bars in the graph of FIG. 8 indicate the average value.

The Knoop hardness measurements indicate that magnesia and yttria have near-identical hardness measurements of about 750 kg/mm$^2$. The 50:50 ratio (by volume) of magnesia to yttria NCOC material increases the hardness to a value of about 1125 kg/mm$^2$. This result therefore indicates that NCOC materials are harder than their constituent materials. When a 3.5 micron compressive layer of a 50:50 mixture of magnesia to yttria was deposited onto a substrate of the same composition, the hardness values increased even further to a value of about 2625 kg/mm$^2$. This data indicates and supports the assertion that an optical element formed and coated with the NCOC material has a hardness value that is greater than the hardness value of an uncoated substrate formed from the same NCOC material. As shown by the data in FIG. 8, the hardness of the optical element formed from the NCOC substrate and coating may be at least twice that of an optical element formed from the same NCOC material but is not coated with the compressive layer. Experimental results that are not shown also indicate that thicker layers of the compressive layer increases hardness.

Figure 9:
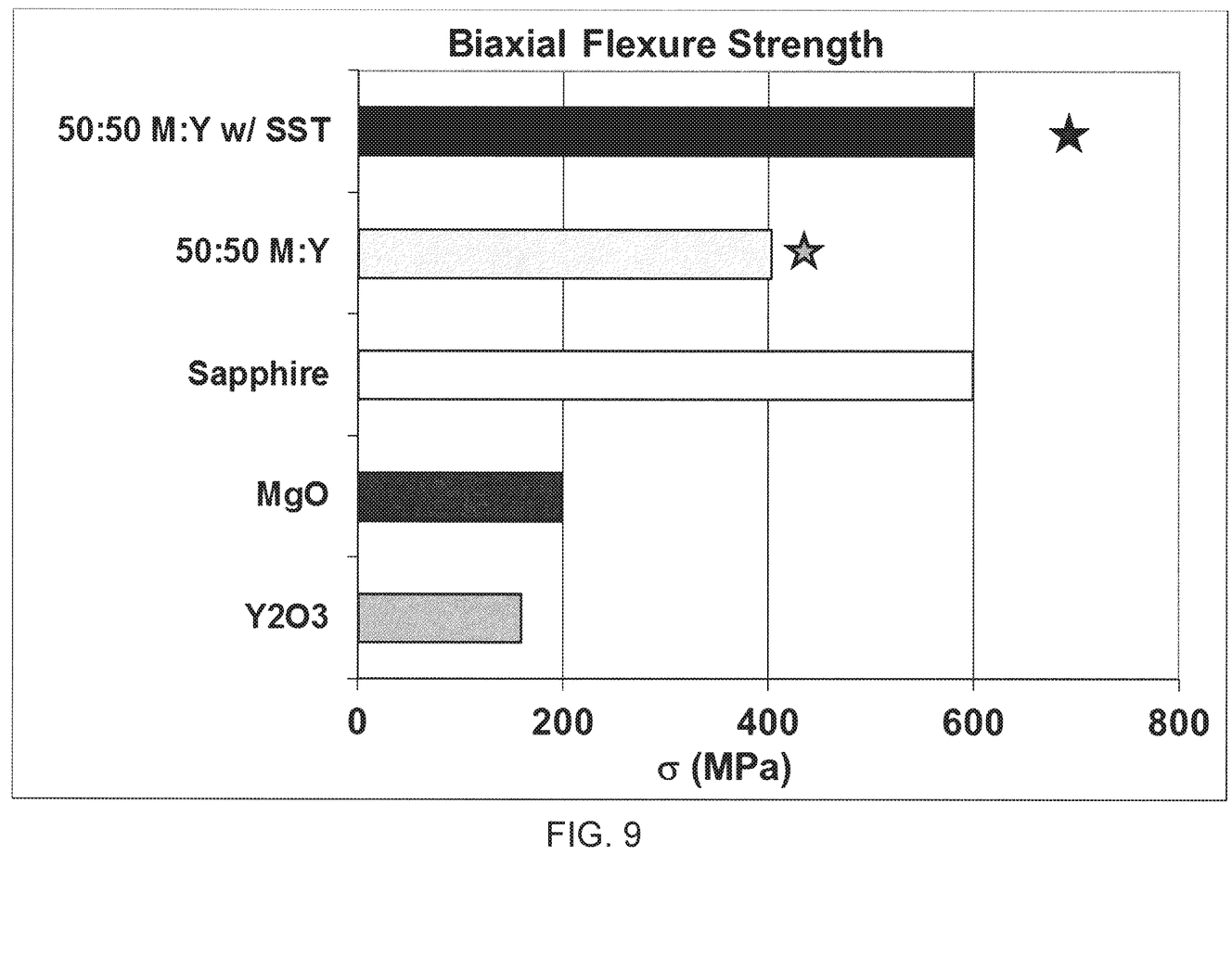
FIG. 9 is a graph comparing the biaxial flexure strength of various materials, nanocomposites, and treated nanocomposites in accordance with aspects of the invention.

Experimental analysis was also performed on samples of materials, including NCOC substrate materials and treated NCOC materials (i.e., coated substrates), to test biaxial flexure strength, and FIG. 9 is a graph showing the results of the flexural strength values of the tested materials. The testing including 1.25 inch diameter samples and 20 measurements were made at room temperature. The bars in the graph of FIG. 9 indicate the average value, and the "star" values indicate maximum values.

At room temperature, yttria has a biaxial flexure strength (also referred to herein as flexural strength) of about 155 megapascals (MPa) and magnesia has a flexural strength of about 200 MPa. Once these materials were combined into a NCOC material having a 50:50 mixture of magnesia and yttria, the flexural strength value increased to about 410 MPa, with a maximum value of about 440 MPa. These results indicate that NCOC materials are stronger than their constituent materials. A 50:50 mixtures of magnesia and yttria NCOC substrates coated with a 3.5 micron thick compressive layer of the same magnesia and yttria NCOC material was also tested and had a flexural strength of about 600 MPa, with a maximum value of about 700 MPa. Other experimental results that are not shown indicate that the flexural strength slightly decreases with higher temperatures (e.g., 450° C., 600° C.) from a value of about 700 MPa at room temperature to a value of about 650 at a temperature of about 600° C. However, even at elevated temperatures, optical elements formed from the NCOC substrates coated with the compressive layer were still stronger than the untreated NCOC substrate materials. The data also indicates that the flexural strength value of an optical element formed from the NCOC substrate coated with the compressive layer was about 50% greater than the flexural strength value of the uncoated NCOC substrate.

The aspects disclosed herein in accordance with the present invention, are not limited in their application to the details of construction and the arrangement of components set forth in the following description or illustrated in the accompanying drawings. These aspects are capable of assuming other embodiments and of being practiced or of being carried out in various ways. Examples of specific implementations are provided herein for illustrative purposes only and are not intended to be limiting. In particular, acts, components, elements, and features discussed in connection with any one or more embodiments are not intended to be excluded from a similar role in any other embodiments. It is to be appreciated that various alterations, modifications, and improvements will readily occur to those skilled in the art. For instance, examples disclosed herein may also be used in other contexts. Such alterations, modifications, and improvements are intended to be part of this disclosure, and are intended to be within the scope of the examples discussed herein. Accordingly, the foregoing description and drawings are by way of example only.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated reference is supplementary to that of this document; for irreconcilable inconsistencies, the term usage in this document controls.

Numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" is intended to be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually. This same principle applies to ranges reciting only one numerical value as a minimum or a maximum.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally," "about," and "substantially," may be used herein to mean within manufacturing tolerances. Or, for example, the term "about" as used herein when modifying a quantity of a component of the invention refers to variation in the numerical quantity that can happen through typical measuring and handling procedures used, for example, when making concentrates or solutions in the real world through inadvertent error in these procedures; through differences in the manufacture, source, or purity of the ingredients employed to make the compositions or carry out the methods; and the like. The term "about" also encompasses amounts that differ due to different equilibrium conditions for a composition resulting from a particular initial mixture.

What is claimed is:

1. An optical element, comprising:
a substrate formed of a Nanocomposite Optical Ceramic (NCOC) material including a first oxide nanograin material dispersed in a second oxide nanograin material; and
a compressive layer of the NCOC material formed on a surface of the substrate,
wherein the compressive layer of the NCOC material has a microstructure different than a microstructure of the substrate, and wherein the microstructure of the compressive layer has a columnar polycrystalline grain structure with grain boundaries extending approximately perpendicular to the surface of the substrate.

2. The optical element of claim 1, wherein the microstructure of the substrate has a grain size that is substantially uniform throughout the substrate and is in a range of about 100 nm to about 200 nm.

3. The optical element of claim 1, wherein the optical element has a hardness value that is greater than a hardness value of an optical element comprising a substrate of the NCOC material formed without the compressive layer.

4. The optical element of claim 1, wherein the optical element has a flexural strength value of at least 600 MPa at room temperature.

5. The optical element of claim 1, wherein the optical element has a flexural strength value that is greater than a flexural strength value of an optical element comprising a substrate of the NCOC material formed without the compressive layer.

6. The optical element of claim 5, wherein the flexural strength value of the optical element is about 50% greater than the flexural strength value of the optical element comprising the substrate of the NCOC material formed without the compressive layer.

7. The optical element of claim 1, wherein the compressive layer has a thickness in a range of about 1.5 microns to about 6 microns.

8. The optical element of claim 1, further comprising a protective layer of one of the first and the second oxide nanograin materials formed on the compressive layer.

9. The optical element of claim 1, wherein the first and the second oxide nanograin materials are selected from yttria ($Y_2O_3$), magnesia (MgO), aluminum oxide ($Al_2O_3$), magnesium aluminum oxide ($MgAl_2O_4$), zirconia ($ZrO_2$), calcium oxide (CaO), beryllium oxide (BeO), silica ($SiO_2$), and germanium oxide ($GeO_2$).

10. The optical element of claim 9, wherein the first oxide nanograin material is yttria and the second oxide nanograin material is magnesia.

11. The optical element of claim 1, wherein the optical element is one of a dome, window, or lens.

* * * * *